United States Patent
Haycock

(10) Patent No.: US 7,034,550 B2
(45) Date of Patent: Apr. 25, 2006

(54) FERROMAGNETIC RESONANCE MEASUREMENT

(75) Inventor: Peter William Haycock, Newcastle-Under-Lyne (GB)

(73) Assignee: Keele University, (GB)

( * ) Notice: Subject to any disclaimer, the term of this patent is extended or adjusted under 35 U.S.C. 154(b) by 0 days.

(21) Appl. No.: 10/399,219

(22) PCT Filed: Oct. 1, 2001

(86) PCT No.: PCT/GB01/04368

§ 371 (c)(1),
(2), (4) Date: Jul. 14, 2003

(87) PCT Pub. No.: WO02/31524

PCT Pub. Date: Apr. 18, 2002

(65) Prior Publication Data

US 2004/0100278 A1    May 27, 2004

(30) Foreign Application Priority Data

Oct. 10, 2000    (GB) .................................. 0024837

(51) Int. Cl.
G01R 27/04    (2006.01)
(52) U.S. Cl. ..................................... 324/637
(58) Field of Classification Search ........ 354/637–646, 354/209, 217
See application file for complete search history.

(56) References Cited

U.S. PATENT DOCUMENTS

| 4,286,216 | A |   | 8/1981 | Auld et al. .................. 324/237 |
| 5,440,238 | A | * | 8/1995 | Martens et al. ............. 324/636 |
| 5,650,725 | A | * | 7/1997 | Powell et al. ............... 324/326 |
| 6,198,293 | B1 | * | 3/2001 | Woskov et al. ............. 324/637 |
| 6,411,105 | B1 | * | 6/2002 | Liu ............................ 324/639 |

FOREIGN PATENT DOCUMENTS

JP         62-035275         2/1987

OTHER PUBLICATIONS

M. E. Unwin, et al., "A Novel broadband ferromagnetic resonance spectrometer," *Journal of Magnetism and Magnetic Materials*, vol. 205, 1999, pp. 199-208.
M. V. Belous, et al., "Ferromagnetic resonance in Quenched High-Carbon Steels," *Phys. Metals*, vol. 6, 1985, pp. 674-680.

* cited by examiner

*Primary Examiner*—Vincent Q. Nguyen
(74) *Attorney, Agent, or Firm*—Woodard, Emhardt, Moriarty, McNett & Henry LLP

(57) ABSTRACT

A method of measuring ferromagnetic resonance properties of a structure including a non-ferrous material reinforced with steel members, the method includes applying a magnetic field to the structure using a magnet located adjacent the structure, directing microwave radiation towards the structure, and detecting the propagation of microwave radiation that is transmitted or reflected by the steel members, the measuring being made with structure in situ.

19 Claims, 1 Drawing Sheet

FERROMAGNETIC RESONANCE MEASUREMENT

BACKGROUND OF THE INVENTION

Figure 1:
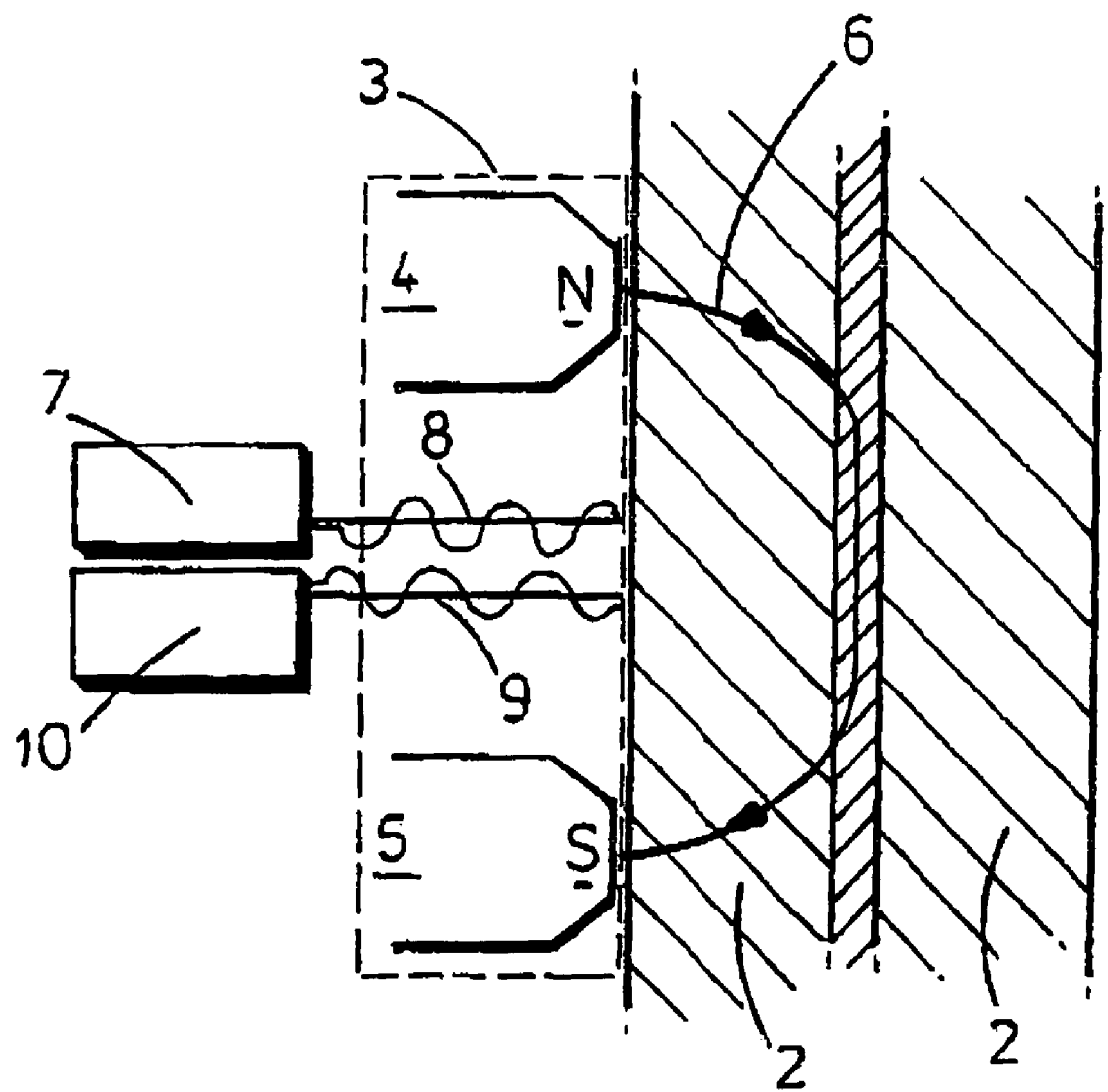

The present invention relates to a ferromagnetic resonance measurement.

A few elements, notably iron, cobalt and nickel show the effect of spontaneous magnetisation, which is termed ferromagnetism. In a ferromagnetic material atoms effectively act as atomic bar magnets which interact co-operatively so that large groups of atoms within a structure have a common orientation of their magnetism. In a quantum mechanical description, the alignment of magnet moments is ascribed to the exchange interaction, which energetically favours magnetic order.

Ferromagnetic resonance measurements are conceptually similar to nuclear magnetic resonance measurements, which form the basis of magnetic resonance imaging (MRI) scanners. A ferromagnetic sample is located in a strong magnetic field. The effect of the strong magnetic field is to align the atomic magnetic moments in a single orientation and to alter the energy levels of excited states of the atoms. Microwave radiation at a predetermined frequency is directed at the sample. The strength of the magnetic field is increased gradually, thereby altering the degree of alignment of the atoms and modifying the energy levels of the excited states of the atoms. When an energy level of an excited state is equal to the energy of the incident microwave photons, the microwave radiation will be resonantly absorbed by the ferromagnetic material.

The amount of microwave radiation absorbed by the sample is monitored using a microwave detector. The values of magnetic field strength which give rise to absorption of the microwave radiation are indicative of the structure of the sample being tested.

In known ferromagnetic resonance measurements, a sample of a material to be tested is located within a resonant cavity, the resonance of the cavity being selected for the frequency of microwave radiation that is to be directed at the sample. The resonant cavity enhances the signal to noise ratio of the ferromagnetic resonance measurement.

Recently, a modified ferromagnetic resonance measurement has been developed wherein a single value, magnetic field is applied to a sample, and microwave radiation directed at the sample is swept over a range of frequencies (M. E. Unwin et al, A novel broadband ferromagnetic resonance spectrometer, Journal of Magnetism and Magnetic Materials, 205(1999) 199–208). The sample is located in a waveguide in such a way as to isolate the microwave radiation so that it travels through the sample in one direction only. This arrangement is based upon a resonant isolator, a microwave circuit device which allows microwave propagation in one direction only.

A disadvantage of known ferromagnetic resonance measurement methods is that they require a sample to be located in a resonant cavity or in a waveguide. Thus, a ferromagnetic resonance measurement of a large sample cannot be carried out, unless part of that sample is removed and located within a resonant cavity or waveguide.

It is an object of the present invention to provide a ferromagnetic resonance measurement method which overcomes or mitigates the above disadvantage.

BRIEF SUMMARY OF THE INVENTION

According to the invention there is provided a method of measuring ferromagnetic resonance properties of a structure comprising a non-ferrous material reinforced with steel members, the method comprising applying a magnetic field to the structure using a magnet located adjacent the structure, directing microwave radiation towards the structure, and detecting the proportion of microwave radiation that is transmitted or reflected by the steel members, the measurement being made with the structure in situ.

The inventors have realised that the ferromagnetic resonance signal from non-corroded steel is very different from that of rust, and that consequently the integrity of a structure comprising non-ferrous material reinforced with steel members can be detected using a ferromagnetic resonance measurement.

The invention provides a quick and direct non-destructive method of determining the degree of corrosion of steel members located inside a non-ferrous material.

The term non-ferrous material is not intended to exclude a material which contains a small amount of ferrous substances. Instead, the term non-ferrous material is intended to mean that the amount of ferrous substances within the material is sufficiently low that it does not affect significantly the measurement according to the invention.

Suitably, the magnetic field is held substantially constant, microwave radiation over a range of frequencies is directed at the structure, and one or more properties of the spectrum of microwave absorption within the steel members is determined as a function of frequency.

Suitably, the shape of the microwave absorption spectrum is determined Alternatively, the frequencies at which maxima of microwave absorption occur may be determined.

Suitably, the microwave radiation is swept over the range of frequencies.

Suitably, the microwave radiation is provided as, a pulse which incorporates the range of frequencies.

Preferably, an antenna is used to direct the pulse of microwaves at the structure, and the same antenna is subsequently used to detect that proportion of the pulse of microwaves that is transmitted or reflected by the steel members.

Suitably, a spectrum analyser is used to determine the spectrum of microwave absorption within the steel members as a function of frequency.

Alternatively, a spectrum analyser is used to determine the frequencies at which maxima of microwave absorption occur.

Suitably, the frequency of the microwave radiation is held substantially constant and the strength of the magnetic field applied to the structure is varied using an electromagnet, the shape of the spectrum of microwave absorption within the steel members being determined as a function of field strength.

Suitably, the frequency of the microwave radiation is held substantially constant and the strength of the magnetic field applied to the structure is varied using an electromagnet, the magnetic field strength at which maxima of microwave absorption occur within the steel members being determined.

Preferably, the method is calibrated by carrying out a series of ferromagnetic resonance measurements of structures having known amounts of corrosion, an unknown amount of corrosion of a structure being determined by carrying out a ferromagnetic resonance measurement of that structure and comparing the results of the measurement with the calibration measurements.

Preferably, the microwave radiation is fixed at, or has a central frequency, at or around 1 GHz.

Preferably, the magnetic field is sufficiently strong to saturate the magnetic state of the steel members.

Preferably, the magnetic field strength is fixed at, or has a central frequency, at or around 0.1 Tesla.

The structure preferably comprises reinforced concrete.

Preferably, a background measurement is taken with no magnetic field applied to the structure, and the results of the background measurement are compared with a subsequent ferromagnetic resonance measurement of the structure, in order to enhance the signal to noise ratio of the measurement.

A specific embodiment of the invention will now be described by way of example only, with reference to the accompanying FIGURE which is a schematic diagram representing a ferromagnetic resonance measurement according to the invention.

DETAIL DESCRIPTION OF THE INVENTION

Referring to FIG. 1, a reinforced concrete all comprises steel bars 1 located within concrete 2. The concrete 2 is a non-ferrous material.

A permanent magnet 3 comprising a north pole 4 and south pole 5 is located against the reinforced concrete wall. A magnetic field produced by the magnet 3 passes through the concrete 2, into the steel bars 1, along the steel bars 1 and back though the concrete 2. A single magnetic field line 6 indicative of the magnetic field generated by the magnet 3 is shown in FIG. 1.

A microwave source 7 generates a white beam of microwaves (i.e. microwaves over a range of wavelengths) which is directed using an antenna 8 into the concrete 2. The microwaves arc reflected by the steel bar 1, pass back through the concrete 2 and are detected by a second antenna 9. The detected microwaves are analysed using a spectrum analyser 10.

The spectrum analyser 10 is used to determine the frequency spectrum of the microwave absorption. The shape of this spectrum is characteristic of steel and/or rust present within the reinforced concrete wall, and the amplitude of the absorption is directly related to the amounts of steel and rust present.

The spectrum analyser 10 is calibrated by testing reinforced concrete having different known levels of corrosion, and storing resulting microwave spectra. Following calibration, the amount of corrosion in a reinforced concrete wall is determined by comparing the measured absorption spectrum with the calibration spectra.

The microwave source 7 may generate tho White beam of microwaves as a pulse. Where this is done only a single antenna 8 is required, the antenna 8 being connected to the microwave source 7 during pulse generation, and connected to the spectrum analyser 10 during pulse detection. A further advantage of the microwave pulse is that it automatically provides broad band of microwave.

The microwave source 7 may provide a continuous beam of microwaves swept over a range of frequencies. Where this is done a spectrum analyser is not required, since the microwave frequency directed at the reinforced concrete wall at any given time is known.

In a further alternative arrangement, microwaves having a fixed frequency may be used and the strength of the magnetic field applied to the reinforced concrete varied. In order to vary the magnetic field the magnet 3 must be an electromagnet rather than a permanent magnet.

The magnetic field preferably saturates the magnetic state of the steel. A preferred value of the magnetic field strength is around 0.1 Tesla at resonance.

A preferred central frequency for the microwaves is around 1 GHz.

The absorption spectrum of microwaves that are transmitted by the reinforced concrete, rather than reflected, may be measured. A measurement of this type is mathematically equivalent to a reflection measurement.

In order to reduce the effect of background noise, a microwave spectrum may be determined without the magnet 3 in place. This background measurement may be compared with a subsequent measurement made with the magnet 3 in place.

The microwave source 7 may be arranged to direct microwaves at the concrete 2 without requiring an antenna.

The invention claimed is:

1. A method for non-destructive determination of the degree of corrosion of steel members of a structure comprising a non-ferrous material reinforced with said steel members, the method comprising measuring ferromagnetic resonance properties of the structure by applying a substantially constant magnetic field to the structure using a magnet located adjacent the structure, directing microwave radiation over a range of frequencies towards the structure, and detecting the proportion of microwave radiation that is transmitted or reflected by the steel members, wherein the measurement is made with the structure in situ and wherein one or more properties of the spectrum of microwave absorption within the steel members are determined as a function of frequency.

2. A method according to claim 1, wherein the shape of the microwave absorption spectrum is determined using a spectrum analyzer.

3. A method according to claim 1, wherein the frequencies at which maxima of microwave absorption occur are determined.

4. A method according to claim 1, wherein the microwave radiation is swept over the range of frequencies.

5. A method according to claim 1, wherein the microwave radiation is provided as a pulse which incorporates the range of frequencies.

6. A method according to claim 5, wherein an antenna is used to direct the pulse of microwaves at the structure, and the same antenna is subsequently used to detect that proportion of the pulse of microwaves that is transmitted or reflected by the steel members.

7. A method according to claim 5, wherein a spectrum analyzer is used to determine the spectrum of microwave absorption within the steel members as a function of frequency.

8. A method according to claim 5, wherein a spectrum analyzer is used to determine the frequencies at which maxima of microwave absorption occur.

9. A method according to claim 1, wherein the frequency of the microwave radiation is held substantially constant and the strength of the magnetic field applied to the structure is varied using an electromagnet, the shape of the spectrum of microwave absorption within the steel members being determined as a function of field strength.

10. A method according to claim 1, wherein the frequency of the microwave radiation is held substantially constant and the strength of the magnetic field applied to the structure is varied using an electromagnet, the magnetic field strength at which maxima of microwave absorption occur within the steel members being determined.

11. A method according to claim 1, wherein the method is calibrated by carrying out a series of ferromagnetic resonance measurements of structures having known amounts of corrosion, an unknown amount of corrosion of a structure being determined by carrying out a ferromagnetic resonance measurement of that structure and comparing the results of the measurement with the calibration measurements.

12. A method according to claim 1, wherein the microwave radiation is fixed at, or has a central frequency, at or around 1 GHz.

13. A method according to claim 1, wherein the magnetic field is sufficiently strong to saturate the magnetic state of the steel members.

14. A method according to claim 1, wherein the magnetic field strength is fixed at, or has a central frequency, at or around 0.1 Tesla.

15. A method according to claim 1, wherein the structure comprises reinforced concrete.

16. A method according to claim 1, wherein a background measurement is taken with no magnetic field applied to the structure, and the results of the background measurement are compared with a subsequent ferromagnetic resonance measurement of the structure, in order to enhance the signal to noise ratio of the measurement.

17. A method for non-destructive evaluation of a structure comprising a non-ferrous material reinforced with steel members, the method comprising determining one or more properties of a spectrum of microwave absorption within the steel members as a function of frequency by applying a substantially constant magnetic field to the structure using a magnet located adjacent the structure, directing a pulse of microwave radiation towards the structure using an antenna, and detecting the proportion of the pulse of microwave radiation that is transmitted or reflected by the steel members with said antenna to determine the degree of corrosion on said steel members, the measurement being made with the structure in situ.

18. A method according to claim 17, wherein a spectrum analyzer is used to determine the spectrum of microwave absorption within the steel members as a function of frequency.

19. A method according to claim 18, wherein a spectrum analyzer is used to determine the frequencies at which maxima of microwave absorption occur.

* * * * *